(12) United States Patent
de Cremoux

(10) Patent No.: US 12,489,452 B2
(45) Date of Patent: Dec. 2, 2025

(54) METHOD OF CORRECTING A DATA STREAM OF A PULSE DENSITY MODULATOR

(71) Applicant: Renesas Design (UK) Limited, Bourne End (GB)

(72) Inventor: Guillaume de Cremoux, Edinburgh (GB)

(73) Assignee: Renesas Design (UK) Limited, Bourne End (GB)

(*) Notice: Subject to any disclaimer, the term of this patent is extended or adjusted under 35 U.S.C. 154(b) by 84 days.

(21) Appl. No.: 17/987,229

(22) Filed: Nov. 15, 2022

(65) Prior Publication Data

US 2024/0162909 A1 May 16, 2024

(51) Int. Cl.
*H03M 1/66* (2006.01)
*H03M 1/06* (2006.01)
(Continued)

(52) U.S. Cl.
CPC ......... *H03M 1/0604* (2013.01); *H03M 1/742* (2013.01); *H03M 1/822* (2013.01)

(58) Field of Classification Search
CPC ...... H03M 7/3011; H03M 1/18; H03M 1/183; H03M 1/466; H03M 3/02; H03M 3/04; H03M 3/338; H03M 3/342; H03M 3/358; H03M 3/37; H03M 3/38; H03M 3/39; H03M 3/424; H03M 3/43; H03M 3/438; H03M 3/458; H03M 3/486; H03M 3/49; H03M 3/502; H03M 3/508; H03M 7/3015; H03M 7/3028; H03M 7/3033; H03F 2200/03; H03F 3/2173; H03F 2200/331; H03F 3/185; H03F 3/183; H03F 3/217; H03F 3/2171; H03F 2200/351;
(Continued)

(56) References Cited

U.S. PATENT DOCUMENTS 6,177,896 B1* 1/2001 Min ..................... H03M 3/504
341/150
9,076,431 B2* 7/2015 Kamath ........... G10K 11/17881
(Continued)

FOREIGN PATENT DOCUMENTS

DE 102011053830 A1 4/2012

OTHER PUBLICATIONS

DE Office Action dated Aug. 11, 2023 received in DE Patent Application No. 10 2023 201 912.4.
(Continued)

*Primary Examiner* — Linh V Nguyen
(74) *Attorney, Agent, or Firm* — SCULLY, SCOTT, MURPHY & PRESSER, P.C.

(57) ABSTRACT

A pulse density modulator encodes an electrical parameter of an external element into a data stream signal. The electrical parameter has a property which causes a predetermined error in the data stream signal. The pulse density modulator includes a digital to analog converter having a sensor element connectable to the external element, and an adjuster circuit adapted to adjust an output of the digital to analog converter based on the data stream signal to correct the predetermined error in the data stream signal. A corresponding method of correcting a data stream signal of a pulse density modulator is also presented.

18 Claims, 8 Drawing Sheets

(51) Int. Cl.
  *H03M 1/74* (2006.01)
  *H03M 1/82* (2006.01)

(58) Field of Classification Search
  CPC ........ H03F 3/68; H03F 1/0211; H03F 1/0277;
       H03F 1/06; H03F 1/52; H03F 1/523;
       H03F 2200/321; H03F 2200/33; H03F
       2200/426; H03F 2200/78; H03F 3/187;
       H03F 3/21; H03F 3/2175; H03F 3/24;
       H03F 3/38
  USPC .......................... 341/144, 118–120, 135, 136
  See application file for complete search history.

(56) References Cited

U.S. PATENT DOCUMENTS

| | | | |
|---|---|---|---|
| 9,532,139 B1* | 12/2016 | Lu | ................ H04R 3/005 |
| 9,633,646 B2* | 4/2017 | Hendrix | ........... G10K 11/17823 |
| 9,819,191 B1 | 11/2017 | Steffan et al. | |
| 9,960,785 B1* | 5/2018 | O'Donoghue | ........ H03M 3/464 |
| 10,044,267 B1 | 8/2018 | Childs | |
| 10,069,399 B1 | 9/2018 | Sambucco et al. | |
| 10,254,314 B1 | 4/2019 | Li | |
| 11,081,963 B2 | 8/2021 | Kasturi | |
| 11,189,261 B1* | 11/2021 | Lu | ................... G10K 11/17881 |
| 2004/0008016 A1 | 1/2004 | Sutardja et al. | |
| 2005/0122162 A1* | 6/2005 | Ishizaki | ............... H03G 3/3021 330/10 |
| 2006/0152203 A1 | 7/2006 | Perry et al. | |
| 2009/0085784 A1* | 4/2009 | Di Giandomenico | ...................... H03M 3/386 341/143 |
| 2009/0146623 A1 | 6/2009 | de Cremoux et al. | |
| 2009/0299592 A1 | 12/2009 | Oehler et al. | |
| 2011/0007907 A1* | 1/2011 | Park | ............... G10K 11/17855 381/71.8 |
| 2013/0127531 A1* | 5/2013 | Lesso | ..................... H03F 3/217 330/251 |
| 2014/0132236 A1* | 5/2014 | Darmawaskita | ...... H02M 3/156 323/283 |
| 2014/0152479 A1* | 6/2014 | Felder | ................ H03M 1/742 341/144 |
| 2014/0239925 A1 | 8/2014 | Tanabe et al. | |
| 2014/0285940 A1 | 9/2014 | Greither | |
| 2015/0065198 A1* | 3/2015 | Anderson | ................ H04B 1/16 455/550.1 |
| 2016/0141957 A1* | 5/2016 | Ozawa | ................... H02M 3/158 323/271 |
| 2016/0315794 A1* | 10/2016 | Talty | ..................... H04B 1/525 |
| 2017/0063228 A1 | 3/2017 | Kimura et al. | |
| 2017/0229962 A1 | 8/2017 | Bansal et al. | |
| 2017/0284825 A1 | 10/2017 | Lesso et al. | |
| 2018/0219484 A1 | 8/2018 | Mercer et al. | |
| 2019/0007010 A1* | 1/2019 | Høyerby | ............... H03F 3/2173 |
| 2019/0267957 A1* | 8/2019 | Lind | ..................... H03F 1/0277 |
| 2020/0059240 A1* | 2/2020 | Moue | ..................... H03M 3/368 |
| 2020/0169267 A1* | 5/2020 | Albinet | ................ H03M 3/342 |
| 2020/0292586 A1 | 9/2020 | Loccia et al. | |
| 2020/0382063 A1* | 12/2020 | Delano | ................ H03F 3/2173 |
| 2021/0126648 A1* | 4/2021 | Zhang | ................ H03M 1/1061 |
| 2021/0175804 A1 | 6/2021 | Shumkov et al. | |
| 2022/0123647 A1 | 4/2022 | Mayell et al. | |
| 2022/0196437 A1 | 6/2022 | Maharyta et al. | |
| 2022/0329256 A1* | 10/2022 | Kanagal Ramesh | ... H03M 1/18 |

OTHER PUBLICATIONS

"Current-Sensing Techniques for DC-DC Converters", Hassan Pooya Forghani-Zadeh et al., The 2002 45th Midwest Symposium on Circuits and Systems, 2002. MWSCAS—2002, Aug. 4-7, 2002, 4 pages.

Non-Final Rejection dated Jul. 12, 2024 received in U.S. Appl. No. 17/881,235.

US Office Action dated Nov. 27, 2024 issued in U.S. Appl. No. 17/881,235.

Notice of Allowance dated Mar. 24, 2025 received in U.S. Appl. No. 17/881,235.

* cited by examiner

METHOD OF CORRECTING A DATA STREAM OF A PULSE DENSITY MODULATOR

TECHNICAL FIELD

The present disclosure relates to a method and corresponding system for correcting a data stream of a pulse density modulator.

BACKGROUND

Pulse density modulators may be used as sensing modules for sensing an electrical parameter of another circuit. For instance a pulse density modulator may be used to sense such a current flowing through a power switch of a switching converter. In such applications the pulse density modulator provides a bitstream having a bitstream density that is proportional to the average of the passing current.

Such systems assume that a linear dependence exists between the bitstream density and the sensed current. In practice the current flowing through the power switch may affect the on resistance of the power switch, which in turn introduces an error in the estimation of the current through the switch.

It is an object of the disclosure to address one or more of the above mentioned limitations.

SUMMARY

According to a first aspect of the disclosure there is provided a pulse density modulator adapted to encode an electrical parameter of an external element into a data stream signal, wherein the electrical parameter has a property which causes a predetermined error in the data stream signal; the pulse density modulator comprising a digital to analog converter comprising a sensor element connectable to the external element, and an adjuster circuit adapted to adjust an output of the digital to analog converter based on the data stream signal to correct the predetermined error in the data stream signal.

For instance the sensing element may be a sensing switch or a sensing resistance. The data stream signal may be a bitstream signal. The electrical parameter may be a current or a voltage or a resistance value.

Optionally, the electrical parameter is a current through the external element. For instance the external element may be a switch such as a power switch or a load switch.

Optionally, the sensor element is a sensing switch and the electrical parameter is a current through an external switch.

For instance the external switch may be a power switch of a power converter.

Optionally, the data stream signal is proportional to an average value of the current through the external switch.

Optionally, an on-resistance of the external switch varies with the current through the external switch. For instance the on-resistance may vary linearly or substantially linearly with the current through the external switch.

Optionally, the digital to analog converter is configured to provide a source current, and the adjuster is configured to generate a correction current for adjusting the source current.

Optionally, the data stream is a bitstream having a bitstream density, and the correction current increases the source current by a predetermined amount to reduce the bitstream density by the predetermined amount.

Optionally, the adjuster comprises a filter circuit.

For example the filter circuit may be a finite impulse response filter, such as an analog FIR filter. For instance the FIR filter may be a FIR DAC.

Optionally, the filter circuit comprises a shift register coupled to a plurality of filter current sources.

Optionally, each filter current source is configured to provide a filter current, and wherein the correction current is the sum of all filter currents.

Optionally, the filter current is defined as the product of a coefficient with a predetermined adjustment current.

Optionally, the coefficients associated with each filter current source are selected to provide a Finite-Impulse-Response filter.

Optionally, the digital to analog converter is a single bit digital to analog converter.

Optionally, the pulse density modulator is adapted to perform sigma delta modulation.

According to a second aspect of the disclosure, there is provided a power supply comprising a power switch coupled to a pulse density modulator according to the first aspect.

For instance the pulse density modulator is adapted to encode a switch current through the power switch into a data stream signal, wherein the switch current has a property which causes a predetermined error in the data stream signal; the pulse density modulator comprising a digital to analog converter comprising a sensor switch connectable to the power switch, and an adjuster circuit adapted to adjust a source current of the digital to analog converter based on the data stream signal to correct the predetermined error in the data stream signal.

The power supply according to the second aspect of the disclosure may comprise any of the features described above in relation to the pulse density modulator according to the first aspect of the disclosure.

According to a third aspect of the disclosure there is provided a method of correcting a data stream signal of a pulse density modulator, the method comprising encoding, with the pulse density modulator, an electrical parameter of an external element into a data stream signal; wherein the electrical parameter has a property which causes a predetermined error in the data stream signal; wherein the pulse density modulator comprises a digital to analog converter having a sensor element connectable to the external element, and adjusting an output of the digital to analog converter based on the data stream signal to correct the predetermined error in the data stream signal.

Optionally, the method comprises calculating a set of data stream errors, wherein each error is associated with a value of the electrical parameter, and using the set of data stream errors to define a predetermined amount for adjusting the output of the digital to analog converter.

Optionally, the electrical parameter is a current through the external element and the digital to analog converter is configured to provide a source current, the method comprising generating a correction current for adjusting the source current.

Optionally, the data stream is a bitstream having a bitstream density, and adjusting the source current comprises increasing the source current of the current source by a predetermined amount to reduce the bitstream density by the predetermined amount.

Optionally, the method comprises providing a filter circuit for generating the correction current.

The third aspect may share features of the first and second aspects, as noted above and herein.

DESCRIPTION OF THE DRAWINGS

The disclosure is described in further detail below by way of example and with reference to the accompanying drawings, in which.

DESCRIPTION

Figure 1A:
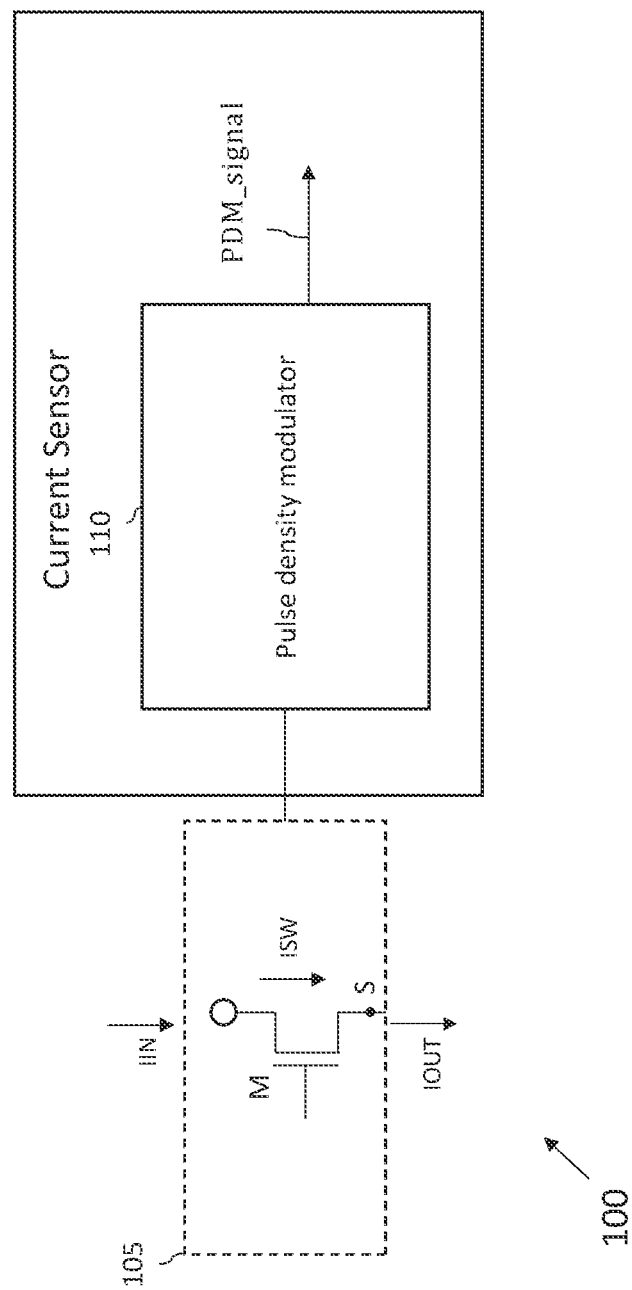
FIG. 1A is a schematic diagram of a current sensor system as described in U.S. patent application Ser. No. 17/881,235.

FIG. 1A is a schematic diagram of a system for sensing an output current (IOUT) and/or an input current (IIN) of a circuit as described in U.S. patent application Ser. No. 17/881,235. The description and discussion of FIG. 1A is not an acknowledgement of prior art.

The circuit 105 has a switch M arranged to selectively couple a sensing node S to a voltage, which depending on the application may be a rail voltage Vdd, an input voltage, or a ground. The switch M may be implemented as a transistor, for example a p-type or an n-type transistor, with a control signal being received at a gate of the transistor.

The switch M is coupled to a current sensor that includes a pulse density modulator (PDM) 110 configured to generate a pulse density modulated signal PDM_signal which is dependent on an average of the current ISW flowing through the switch M. The current sensor is configured to sense the average output current and/or the average input current of the circuit 105 using the pulse density modulated signal.

The circuit 105 may be a power converter. For example, the circuit 105 may be a switching power converter, such as, but not limited to, a buck converter, a boost converter or a buck-boost converter. The power converter may be an inductive power converter or a capacitive power converter (charge pump). The power converter may be an AC-DC power converter or a DC-DC power converter. The switch M may be a power switch or a load switch. A power switch may be a high side switch or a low side switch of power converter. A load switch can conduct current during a long period of time, for instance one hour and can be used to sense current.

Figure 1B:
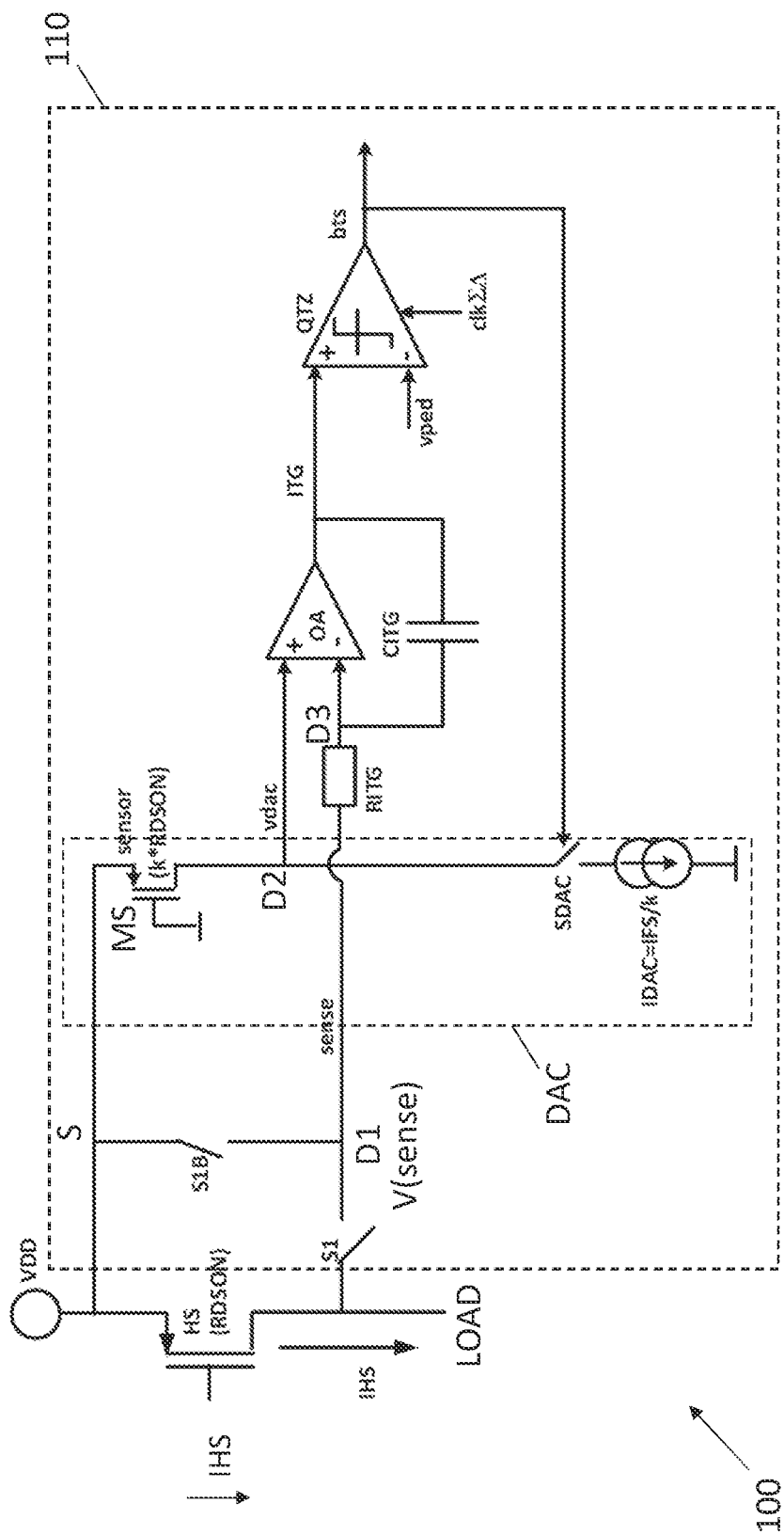
FIG. 1B is an exemplary implementation of the current sensor system of FIG. 1A.

FIG. 1B illustrates an implementation of a current sensor system as described in U.S. patent application Ser. No. 17/881,235. The system of FIG. 1B may be used to perform continuous-time sigma-delta (CTSD) telemetry. The description and discussion of FIG. 1B is not an acknowledgement of prior art.

In this example the PDM 110 is used for sensing an output current IHS of a load switch or a power switch HS used for driving a load, such as CPU. The switch HS may be a power FET. The switch HS selectively couples the load to a first voltage Vdd. It will be appreciated that the switch HS may remain in an ON state continuously over a long period of time, for example an hour. The switch HS may be controlled to be alternatively on (closed) and off (open).

The switch HS is coupled to the pulse density modulator (PDM) 110 configured to generate a pulse density modulated signal bts which is dependent on an average of the current IHS flowing through the switch HS.

The pulse density modulator includes a sensor switch MS and an operational amplifier OA coupled to a quantizer QTZ. A capacitor CITG is provided on a feedback loop of the operational amplifier OA, such that the amplifier and the capacitor implement a signal integrator.

The quantizer QTZ has a first input coupled to the output of the amplifier, a second input coupled to a quantizer reference voltage Vped and an output for providing the pulse density modulated signal bts. The quantizer receives a clock signal clk $\Sigma\Delta$. The pulse density modulator further comprises a DAC switch SDAC coupled to the current source and operable by the output of the quantizer QTZ.

The pulse density modulator 110 receives a first differential signal at the first input of the operational amplifier OA and a second differential signal at the second input of the OA. The first differential signal is given by the voltage V(sense) at node D1 (with respect to Vdd at node S) through the resistance RITG at node D3, and the second differential signal is given by the voltage vdac at node D2 (with respect to Vdd at node S). The pulse density modulator 110 is configured such that it continuously tries to eliminate the difference between the first differential signal and the second differential signal.

In operation, when a current IHS passes through the switch HS, the switch S1 is turned ON and the switch S113 is turned off. The voltage V(sense) at node D1 is in this case (VDD−RDSON*IHS). Over time, with HS switching ON/OFF, V(sense) tracks IHS in the time domain.

Assuming as the starting point that the data stream bts='0', then the voltage at node D2, vdac=VDD because the switch SDAC is OFF. The voltage V(sense) being lower than vdac, the net output of the operational amplifier ITG increases by action of the OA and the integrating path {RTIG, CITG}. The output ITG charges the capacitor CITG and the voltage across CITG increases.

At some point the voltage at the output of the operational amplifier V(ITG) crosses an arbitrary threshold vped and bts swaps to '1', thus turning ON the switch SDAC. The current IDAC is sized as a fraction of a full-scale current IFS so that IDAC=IFS/k.

The sensor switch MS is sized k-times smaller than the switch HS, so that its resistance is k*RD SON. Consequently vdac=(VDD−IFS*RD SON), by elimination of the factor k.

If the full-scale current IFS is designed to always exceed the current IHS, then the voltage vdac becomes lower than V(sense) and ITG will stop increasing, and will decrease instead, until it goes back below vped. This will switch bts back to '0', and another cycle is re-started. The bitstream bts is thus a bit stream of '0' and '1': this is the sigma-delta modulation.

The bitstream density N (number of bits to '1' over the total number of bits, e.g. 1024) allows to determine the current IHS. Since the Sigma-Delta modulation matches the averages <vdac> and <V(sense)>, this means:

$$(N/1024)*vdac=<V(\text{sense})> \quad (1)$$

Or:

$$(N/1024)*k*RDSON*IFS=RDSON*<IHS> \quad (2)$$

By elimination of RDSON:

$$(N/1024)*IFS=<IHS> \quad (3)$$

Figure 2:
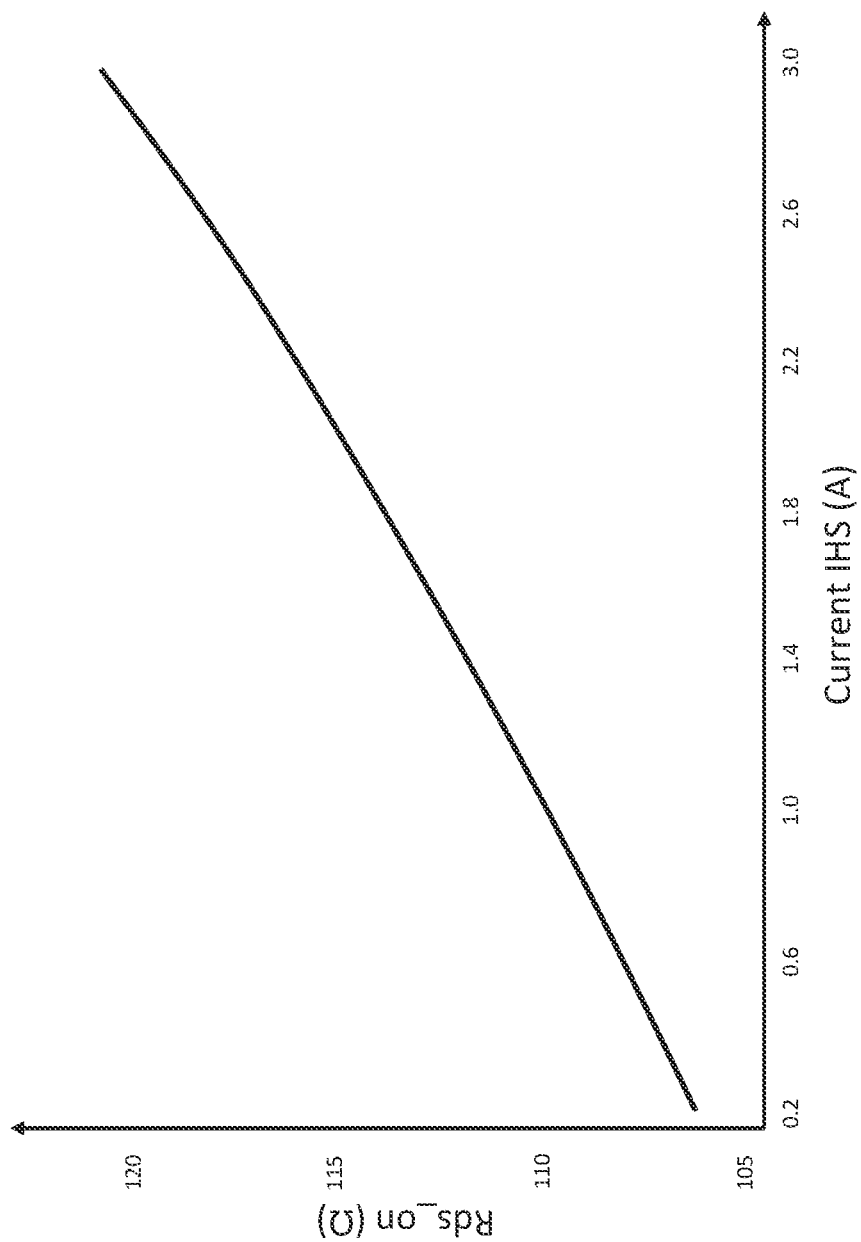
FIG. 2 is a plot of the on resistance of a power switch as a function of the current passing through it.

FIG. 2 is a plot of the on resistance RDSON of the power switch HS of FIG. 1 as a function of the current IHS passing through it.

For this critical corner {VGS=3V; TdegC=85 degC}, RDSON is 106 mΩ for a current IHS of 0.2 A, and 121 mΩ for IHS of 3.0 A. Therefore, RDSON is not constant on the right side of the equation (2); but varies by 13%. For the sensor contribution (left side of equation (2)), the quantity k*RDSON is constant. Consequently, eliminating RDSON in the equation (2) leads to a 13% error, while the telemetry allowance is +/−1% for the sensor ratio.

One can express this unwanted RDSON 13% variation of the switch HS from OA to 3 A as:

$$RDSON=RDSON0*(1+13\%*IHS/3A) \quad (4)$$

In which case V(sense) becomes:

$$V(\text{sense})=VDD-IHS*RDSON0*(1+13\%*IHS/3A) \quad (5)$$

V(sense) now varies in a quadratic way: there are the terms IHS and IHS^2 in the equation.

One might consider implementing a digital correction, based on a Look-Up-Table (LUT). In this case if a 3 A current passes through the switch HS, one would read a greater value (3 A+13%) in the bitstream density, which could be corrected by subtracting this same 13% error. However, one of the main assets of the CTSD telemetry is to integrate/average the current IHS over time. For example, if after 1 ms one examine the bitstream and found that IHS was on average 1 A, it may have been because IHS was a constant 1 A value. Alternatively, IHS may have been 2 A during half of the time and OA the rest of the 1 ms time. Consequently, the system does not know if the correction should be applied for 1 A or for 2 A. Therefore, a digital LUT-based correction is not a suitable solution.

Figure 3:
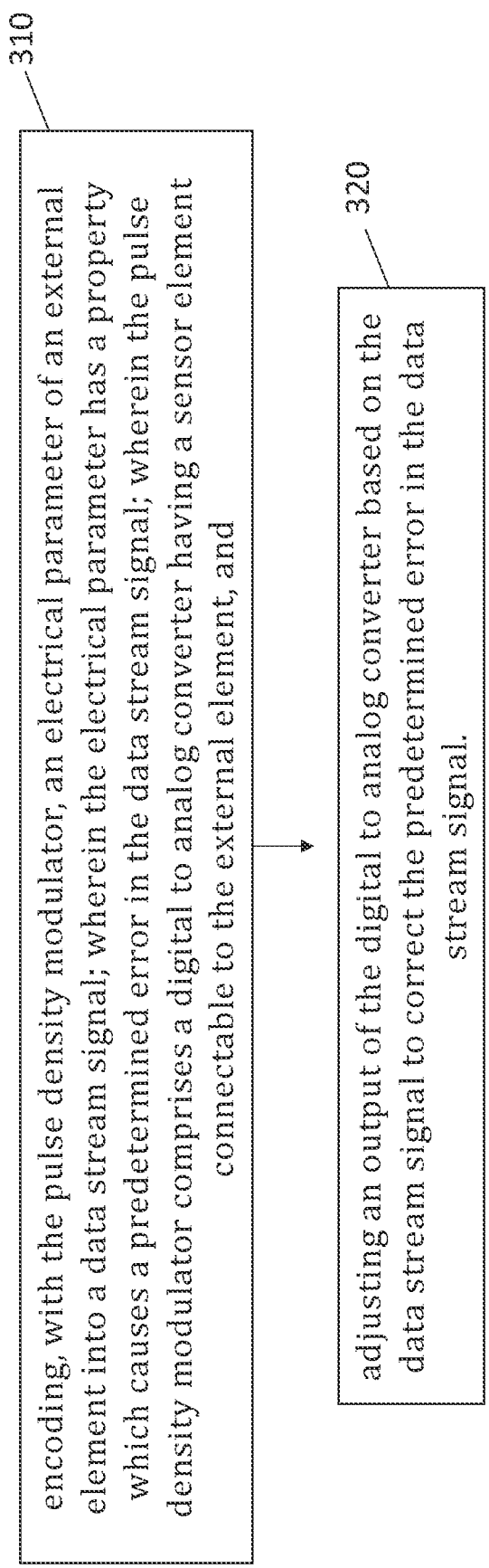
FIG. 3 is a flow chart of a method for correcting a data stream signal of a pulse density modulator according to the disclosure.

FIG. 3 is a flow chart of a method for correcting a data stream signal of a pulse density modulator according to the disclosure. The data stream may be a bitstream having a bitstream density N.

At step 310 the pulse density modulator encodes an electrical parameter of an external element into a data stream signal or pulse density signal. The electrical parameter has a property which causes a predetermined error in the data stream signal. The pulse density modulator comprises a digital to analog converter having a sensor element connectable to the external element.

At step 320 an output of the digital to analog converter is adjusted based on the data stream signal to correct the predetermined error in the data stream signal.

For instance, the electrical parameter may be a current passing through the external element, such as a switch. In this example the digital to analog converter provides a source current and a correction current is generated for adjusting the source current.

The correction current may be used to increase the current of the source current by a predetermined amount to reduce the bitstream density N by the predetermined amount.

The predetermined amount may be defined using an error function or a data structure such as an error table tabulating a specific error, for instance a percentage error, for different values of the parameters of interest. For instance a current passing through a power switch may be associated with a specific error value or error percentage.

The method of FIG. 3 may be used with any pulse density modulator configured to provide a sigma-delta modulation. It provides an analog gain compensation for sigma-delta data modulators.

Figure 4:
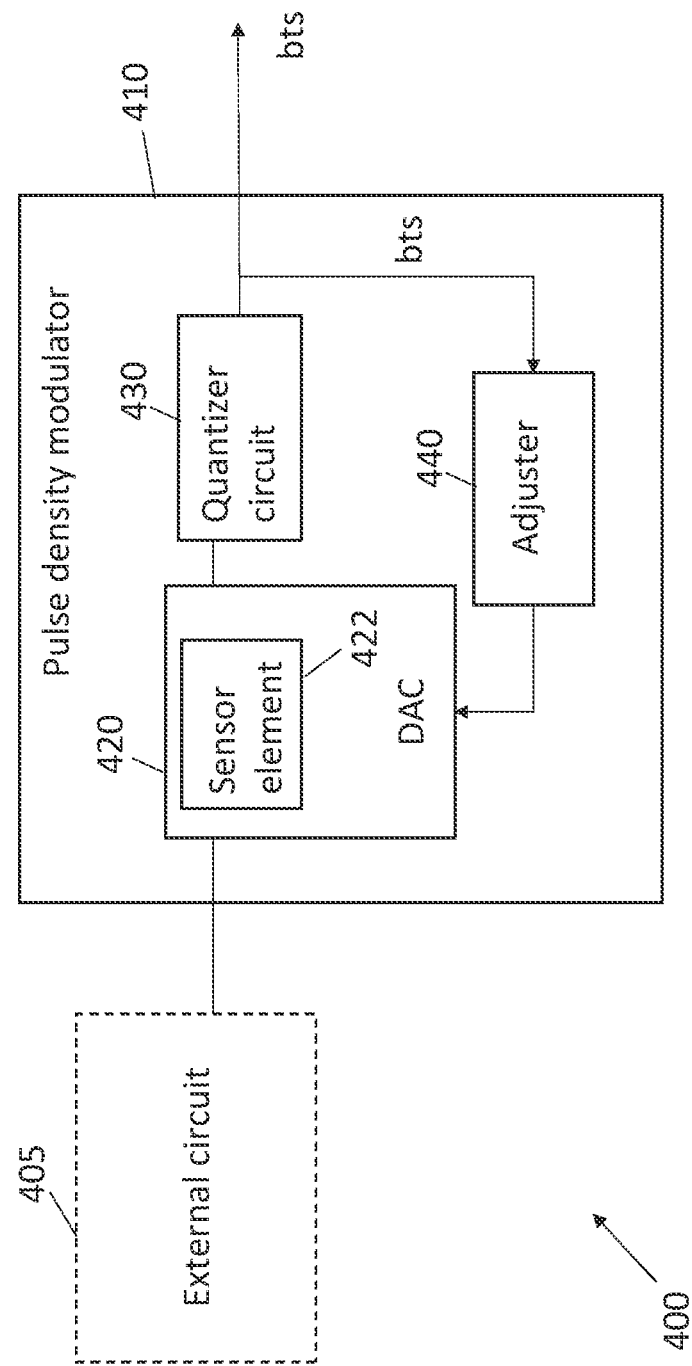
FIG. 4 is a schematic diagram of a pulse density modulator with adjuster circuit for implementing the method of FIG. 3.

FIG. 4 is a schematic diagram of a pulse density modulator for implementing the method of FIG. 3.

The system 400 shows a pulse density modulator 410 coupled to an external circuit 405. For instance the external circuit 405 may be a switched mode power supply such as buck, a boost or a buck-boost converter. The external circuit 405 could also be an inductive power converter or a capacitive power converter such as a charge pump. The external circuit 405 would have at least one power switch, also referred to as pass switch.

The pulse density modulator 410 is adapted to encode an electrical parameter of an element of the circuit 405 into a data stream signal, also referred to as bitstream bts. The bitstream bts can be used by a digital processing circuit (not shown). For instance the electrical parameter may be a current flowing through a power switch of the external circuit 405. The electrical parameter could also be a voltage or a resistance associated with an element of the circuit 405.

The pulse density modulator 410 includes a digital to analog converter DAC 420, a quantizer circuit 430 configured to perform sigma-delta modulation, and an adjuster 440.

The digital to analog converter DAC 420 comprising a sensor element 422. The sensor element 422 is coupled to an external element of the circuit 405. For instance the DAC 420 may be a single-bit DAC. The sensor element 422 can take different forms depending on the application. For instance the senor element may be a sensing switch or a sensing resistance.

The adjuster circuit 440 is adapted to adjust an output of the DAC 420 based on the data stream signal to correct, or compensate for, the predetermined error in the data stream signal bts.

In operation the adjuster 440 receives the bitstream bst from the quantizer circuit 430 and generates a correction signal for adjusting the output of the DAC 420. The correction signal is based on a predetermined error of the bitstream. The adjuster 440 may be implemented in different ways. For example the adjuster may include a filter such as a finite impulse response filter (FIR) or a FIR DAC.

The bitstream may be read or processed to evaluate the electrical parameter (for instance a current having a specific value e.g. 3 A). For instance a shift register may be used to receive the bitstream. The correction signal, for instance a correction current is then generated by the adjuster 440 to correct the bitstream.

For instance the DAC 420 may provide a source current and the adjuster circuit 440 adjusts the source current based on the data stream signal to correct or compensate for the error in the data stream signal. The correction provided by the adjuster 440 can be used to obtain a measurement of the parameter of interest with a greater accuracy, hence improving the operation of the external circuit 405.

Figure 5:
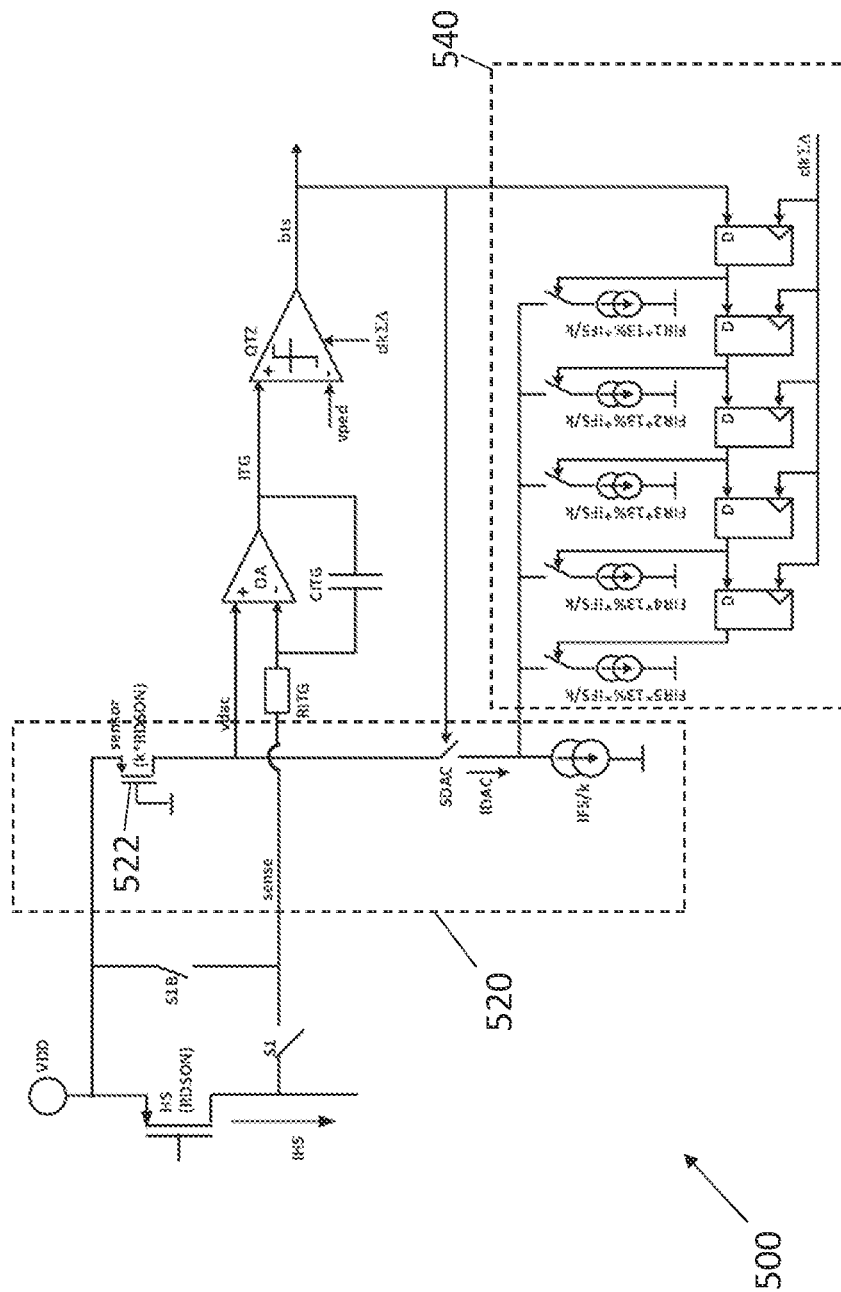
FIG. 5 is an exemplary implementation of the pulse density modulator of FIG. 4.

FIG. 5 is an exemplary implementation of the pulse density modulator of FIG. 4.

The circuit 500 of FIG. 5 is similar to the circuit of FIG. 1B, but now includes an additional adjuster circuit 540 coupled to a DAC 520 provided with sensor switch 522. The other components of the circuit are represented with the same references as in FIG. 1B and their description will not be repeated for sake of brevity.

Figure 6:
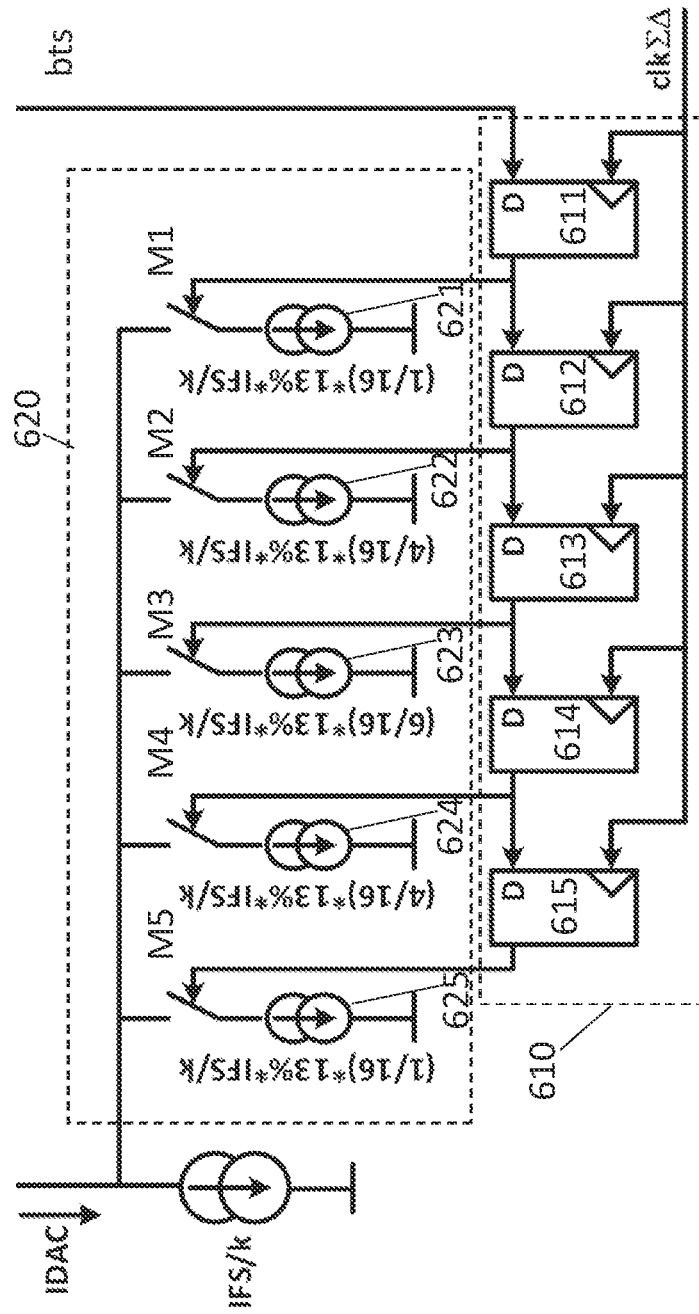
FIG. 6 is a diagram of an adjuster circuit as used in the pulse density modulator of FIG. 5.

FIG. 6 shows an enlarged version of the adjuster circuit 540. The adjuster 540 is implemented as a filter that includes a shift register 610 coupled to a plurality of filter current sources 620.

In this example a 5-bit shift register is used having five storage elements, for example five flip flops labelled 611-615, connected in series. Each flip flop is controlled by a common clock signal. This clock signal is the same clock signal received by the quantizer QTZ.

The first flip flop 611 receives the bitstream signal from the quantizer QTZ. The output of each flip flop is provided to the input of the next flip flop and to a switch for coupling a corresponding filter current source to the main current source of the pulse density modulator.

Five current sources are provided labelled 621-625. The output of the flip flop 611 is provided to the input of flip flop 612 and to the switch M1 for coupling the current source 621 to the main current source. Similarly, the output of the flip flop 612 is provided to the input of flip flop 613 and to the switch M2 for coupling the current source 622 to the main current source, etc . . . .

Each filter current source is configured to provide a predetermined current defined as I=Coeff*13%*IFS/k, in which Coeff is a filter coefficient FIR which can take different values. In this example the coefficients FIR1-FIR5 of the current sources 621, 622, 623, 624, 625 are 1/16, 4/16, 6/16, 4/16, 1/16, respectively.

As mentioned above the power switch HS-FET has a on resistance RDSON that varies with the intensity of the current IHS passing through the switch.

The adjuster circuit 540 is used to vary the current IDAC (and vdac) that is applied whenever bts='1' so that IDAC=IFS/k+Icorr in which Icorr is a correction current generated by the adjuster circuit 540.

Therefore, the current IDAC is now the sum of the baseline IFS/k and, for this example, 5 correcting smaller current sources 621-625.

If the shift register receives a bit stream made only of '1', bts="11111", all the switches M1-M5 are activated and a correction current=(16/16)*13%*IFS/k is provided.

If the shift register receives a bit stream="00000" no switch is activated, and no correction current is provided.

If the shift register receives a bit stream="10010" the switches M1 and M4 are switched on (closed) while the remaining switches are off (open). In this case a correction current=(7/16)*13%*IFS/k is provided.

Therefore, for intermediate values of bitstream density, a correction, in the range [0%; 13%] is added to the baseline IFS/k. This correction increases linearly with the bitstream density (property of FIR-DAC's).

It will be appreciated that this current correction function could also be achieved with all current sources having a same coefficient, Coeff. However, in this example each filter current source is weighted to obtain the behavior of a Finite-Impulse-Response DAC (FIR-DAC). This permits to smooth the total current IDAC in the time domain and provides a trade-off between settling and smoothing. Although represented as part of the adjuster 540, the shift-register 610 may be part of the DAC 520.

It will also be appreciated that the circuit 620 generating the correction current may implemented in a different way. For instance, instead of using a plurality of filter current sources, a variable resistance RFIR may be used. The value of the resistance RFIR can be varied depending on the bitstream density to generate a correction current as the ratio VREF/RFIR. The correction current could then be added to the current source IFS/k.

The effect of the correction can be explained as follows. When the current IHS through the power switch HS is high, more '1' are present in the bitstream, so the FIR-DAC increases the total current IDAC. To still match the average voltage <vdac> with the average voltage <V(sense)>, the sigma-delta must decrease the bitstream density. This correction compensates (in the analog domain) for the RD SON increase of the power switch.

Before applying this correction, the average voltage across the sensor was: <VDS(sensor)>=VDD−vdac=(N/1024)*RDSON0*IFS By adjusting the current IDAC with N, the average voltage across the sensor becomes: <VDS(sensor)>=(N/1024)*RDSON0*IFS*(1+13%*N/1024)

The Sigma-Delta still matches the average VDS(HS) and VDS(sensor):

$$<VDS(HS)>=<VDS(sensor)>$$

Introducing the VDS(HS) affected by the 13%-varying RDSON, and the new trick on VDS(sensor), one get:

$$RDSON0*(1+13\%*IHS/3A)*IHS=(N/1024)*RDSON0*IFS*(1+13\%*N/1024)$$

By separating and simplifying in a polynomial, the following equation can be derived:

$$IHS+(IHS^2)*13\%/3A=(N/1024)*IFS+(N/1024)^2*13\%*IFS$$

It is mathematically possible only if each polynomial term is matched, so we retrieve the ideal equation:

$$(N/1024)*IFS=IHS$$

The bitstream correction on IDAC permits to restore the linear dependency between the bitstream density N and the current value to be read IHS.

As the load increases from 0.2 A to 3 A the on resistance RDSON increases by +13% over this range. If no correction is applied the sensed current through the power switch has an error of 8%. This error is reduced to 1% with the FIR correction.

Figure 7:
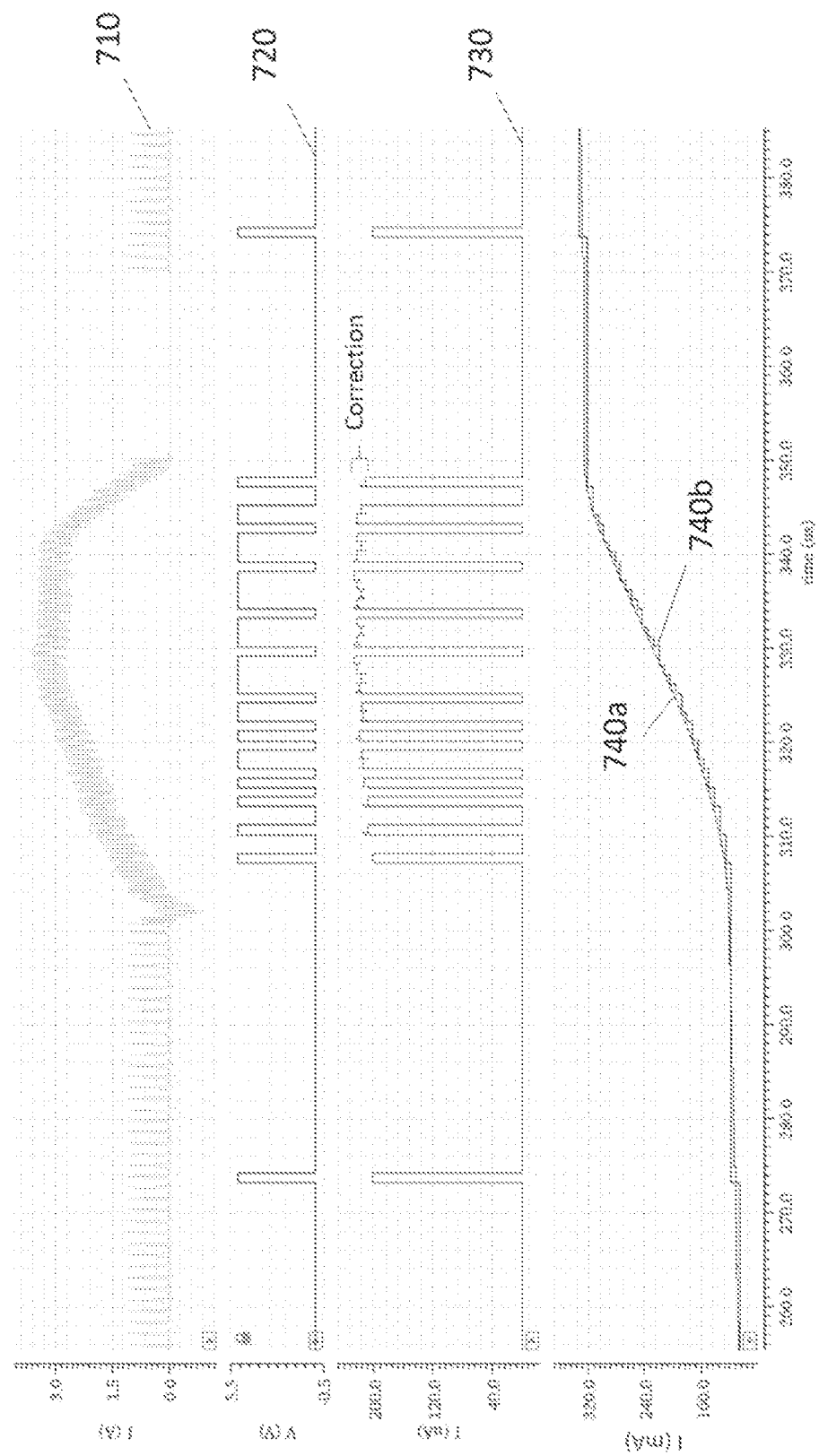
FIG. 7 is a transient simulation obtained for a pulse density modulator provided with an adjuster for measuring current through a power switch.

FIG. 7 is a transient simulation obtained for a pulse density modulator provided with an adjuster for measuring current through a power switch.

For the transient simulation the proposed pulse density modulator with adjuster is coupled to a Buck converter.

The first waveform 710 shows the inductor current IL which is proportional to the current IHS through the power switch (HIS=duty cycle*IL). The second waveform 720 is the pulse density modulated signal or bitstream bts. The third waveform 730 shows the current IDAC.

The transient load waveform 710 shows transitions pulse-skipping/PWM. At light load, RDSON(HS) is around RDSON0, so no correction is applied. When a large load is applied, the bitstream density increases (see longer pulses of waveform 720). The IDAC current (730) is thus undergoing the FIR-DAC correction and increases, thus forcing the sigma-delta to limit the bitstream density N.

The waveforms 740a and 740b are shown to compare the mathematical integrated BUCK current and the measured current. A 1% match is obtained once the correction is introduced, with the HS switch including a Rdson having a 13% error over the current range.

A skilled person will appreciate that variations of the disclosed arrangements are possible without departing from the disclosure. Accordingly, the above description of the specific embodiments is made by way of example only and not for the purposes of limitation. It will be clear to the skilled person that minor modifications may be made without significant changes to the operation described.

The invention claimed is:

1. A pulse density modulator adapted to encode an electrical parameter of an external element into a data stream signal, wherein the electrical parameter has a property which causes a predetermined error in the data stream signal; the pulse density modulator comprising:
    a digital to analog converter comprising a sensor element connectable to the external element;
    a quantizer circuit adapted to receive a clock signal and to output the data stream signal; and
    an adjuster adapted to adjust an output of the digital to analog converter based on the data stream signal to correct the predetermined error in the data stream signal,
    wherein:
        the adjuster comprises a filter circuit, wherein the filter circuit comprises a plurality of filter current sources coupled to a plurality of switches;
        the pulse density modulator further comprises a shift register adapted to control the plurality of switches; and
        the shift register comprises a plurality of flip-flops connected in series, wherein each flip-flop receives the clock signal, and wherein a first flip-flop in the shift register is configured to receive the data stream signal from the quantizer circuit.

2. The pulse density modulator as claimed in claim 1, wherein the electrical parameter is a current through the external element.

3. The pulse density modulator as claimed in claim 2, wherein the sensor element is a sensing switch, and wherein the electrical parameter is a current through an external switch.

4. The pulse density modulator as claimed in claim 3, wherein the data stream signal is proportional to an average value of the current through the external switch.

5. The pulse density modulator as claimed in claim 3, wherein an on-resistance of the external switch varies with the current through the external switch.

6. The pulse density modulator as claimed in claim 2, wherein the digital to analog converter is configured to provide a source current, and wherein the adjuster is configured to generate a correction current for adjusting the source current.

7. The pulse density modulator as claimed in claim 6, wherein the data stream is a bitstream having a bitstream density, and wherein the correction current increases the source current by a predetermined amount to reduce the bitstream density by the predetermined amount.

8. The pulse density modulator as claimed in claim 6, wherein each filter current source is configured to provide a filter current, and wherein the correction current is the sum of all filter currents.

9. The pulse density modulator as claimed in claim 8, wherein the filter current is defined as the product of a coefficient with a predetermined adjustment current.

10. The pulse density modulator as claimed in claim 9, wherein the coefficients associated with each filter current source are selected to provide a Finite-Impulse-Response filter.

11. The pulse density modulator as claimed in claim 1, wherein the digital to analog converter is a single-bit digital to analog converter.

12. The pulse density modulator as claimed in claim 1, wherein the pulse density modulator is adapted to perform sigma-delta modulation.

13. A power supply comprising a power switch coupled to a pulse density modulator as claimed in claim 1.

14. A method of correcting a data stream signal of a pulse density modulator, the method comprising:
    encoding, with the pulse density modulator, an electrical parameter of an external element into a data stream signal, wherein:
        the electrical parameter has a property which causes a predetermined error in the data stream signal;
        the pulse density modulator comprises a digital to analog converter having a sensor element connectable to the external element, a quantizer circuit adapted to receive a clock signal and to output the data stream signal, and an adjuster; and
    adjusting, with the adjuster, an output of the digital to analog converter based on the data stream signal to correct the predetermined error in the data stream signal,
    wherein:
        the adjuster comprises a filter circuit, the filter circuit comprising a plurality of filter current sources coupled to a plurality of switches;
        the pulse density modulator further comprises a shift register adapted to control the plurality of switches; and
        the shift register comprises a plurality of flip-flops connected in series, wherein each flip-flop receives the clock signal, and wherein a first flip-flop in the shift register is configured to receive the data stream signal from the quantizer circuit.

15. The method as claimed in claim 14, comprising calculating a set of data stream errors, wherein each error is associated with a value of the electrical parameter, and using the set of data stream errors to define a predetermined amount for adjusting the output of the digital to analog converter.

16. The method as claimed in claim 14, wherein the electrical parameter is a current through the external element and wherein the digital to analog converter is configured to provide a source current, the method comprising generating a correction current for adjusting the source current.

17. The method as claimed in claim 16, wherein the data stream is a bitstream having a bitstream density, and wherein adjusting the source current comprises increasing the source current of the current source by a predetermined amount to reduce the bitstream density by the predetermined amount.

18. The method as claimed in claim 16, wherein the filter circuit is configured to generate the correction current.

* * * * *